(12) United States Patent
Hall et al.

(10) Patent No.: US 6,404,309 B1
(45) Date of Patent: Jun. 11, 2002

(54) TUNER WITH NON-EDGE RF INPUT PIN/LEAD

(75) Inventors: Edward Allen Hall, Carmel, IN (US); Tey Tiam Fatt; Pang Kim Suan, both of Singapore (SG)

(73) Assignee: Thomson Licensing, S.A., Boulogne (FR)

( * ) Notice: Subject to any disclaimer, the term of this patent is extended or adjusted under 35 U.S.C. 154(b) by 0 days.

(21) Appl. No.: 09/590,910

(22) Filed: Jun. 9, 2000

(51) Int. Cl.⁷ ................................................. H05K 5/04
(52) U.S. Cl. .......................... 334/85; 361/816; 361/818
(58) Field of Search ................................ 361/816, 818; 334/85

(56) References Cited

U.S. PATENT DOCUMENTS

| | | | | |
|---|---|---|---|---|
| 4,841,414 A | * | 6/1989 | Hibino et al. | ................ 361/424 |
| 6,011,700 A | * | 1/2000 | Matsuzaki | ................... 361/816 |
| 6,118,672 A | * | 9/2000 | Yamauchi et al. | ........... 361/818 |

* cited by examiner

*Primary Examiner*—Justin P. Bettendorf
*Assistant Examiner*—Damian Cathey
(74) *Attorney, Agent, or Firm*—Joseph S. Tripoli; Robert D. Shedd; Frederick A. Wein

(57) ABSTRACT

A shielded modular tuner is horizontally mounted onto a chassis printed circuit board and is provided, through an aperture in the shield, with lead connections from the edge of the tuner printed circuit board to the chassis printed circuit board, for power supply, control signals, outputting a processed signal, etc. The RF signal is coupled to the tuner via a conductive pin/lead extending from an RF signal conducting path on the chassis printed circuit board, passing through a second aperture in the shield, directly to the point on the tuner printed circuit board where the signal is to be inputted for tuner processing. In this way, the RF signal is injected directly into the tuner precisely where it is needed without being led along a longer and possibly meandering path from the edge of the tuner printed circuit board, and without a shielded coaxial cable and accompanying connectors.

6 Claims, 2 Drawing Sheets

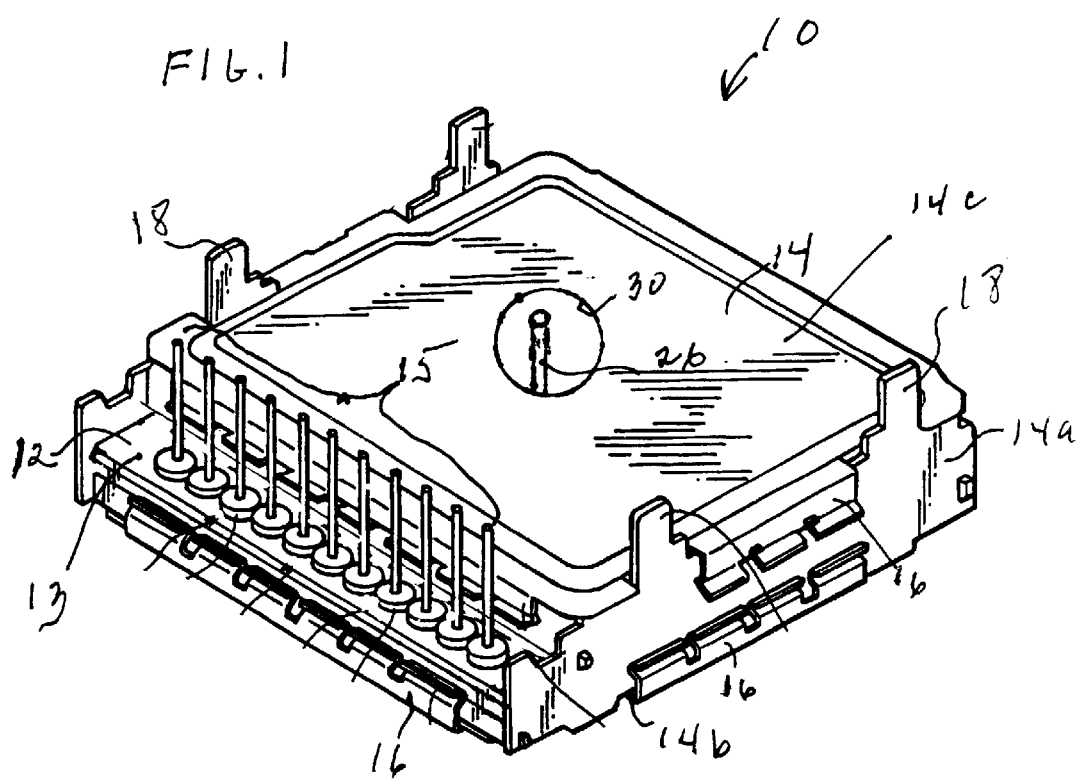

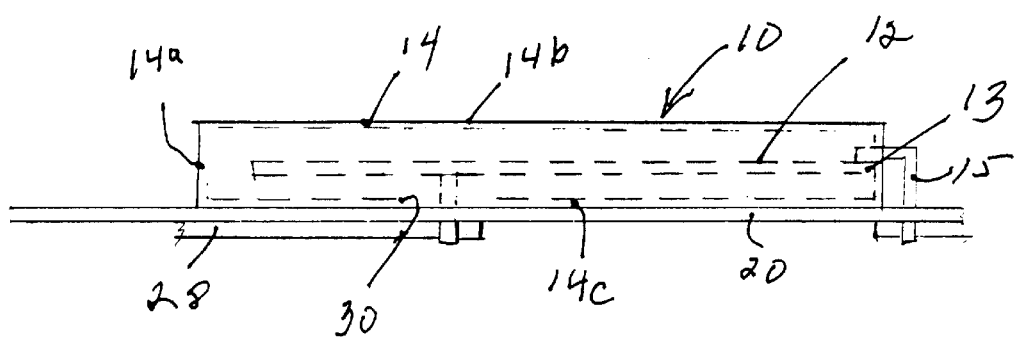

TUNER WITH NON-EDGE RF INPUT PIN/LEAD

BACKGROUND

In a television tuner or other high-frequency receiving equipment, a tuner often includes a printed circuit board on which circuit components have been mounted and which is housed in a shielding case. It is common for low level RF signals, such as signals received from an antenna, CATV device or DSB device to be coupled to the receiver through a connector which permits the receiver to be easily connected or disconnected to/from this RF source. Such RF signals are then processed by a tuner section within the receiver. From a signal point of view, it would be best to place the printed circuit board of the tuner located right at the RF connector within a shielded enclosure In a television tuner or other high-frequency equipment, a circuit board on which circuit components have been mounted is housed in a shielding case, such as shown in U.S. Pat. No. 5,053,910 of Goldstein, where the RF signal is directly connected through an electrically conductive pin from the RF connector to the printed circuit board mounted at the back of the connector. However, in the usual case, this is not practical and the tuner is located at a distance from the RF signal input connector.

Additionally, it is often necessary to use shock hazard precautions for the externally accessible RF connector because of "hot chassis" considerations since the chassis often is connected to one side of the AC line. Such situations are shown in U.S. Pat. No. 5,351,018 of Lehmann et al. and U.S. Pat. No. 4,816,612 of Yeom. Such "isolation barrier" precautions are provided between the connector and the tuner requiring the tuner to be located at a distance from the RF signal input connector.

In the situations discussed above, because of the low RF signal level, it is desirable to use a shielded coaxial interface cable with a connector at the distal end of the cable to carry the signal to the modular tuner, which has a complementary connector for receiving the RF signal. Such a situation is shown in '612 cited above. Horizontally mounted tuners with a connector for receiving such a shielded cable are shown in U.S. Pat. No. 6,001,700 of Matsuzaki, U.S. Pat. No. 4,920,455 of Maier et al. and U.S. Pat. No. 4,628,412 of Nigorikawa. This shielded cable and the pair of complementary connectors represent a significant cost and it is desirable to eliminate these parts costs along with the respective assembly steps, especially in consumer electronics products which have very competitive pricing.

Further, if a shielded cable is not used, then it is desirable for the connection to the tuner to be direct and short to eliminate picking up extraneous signals and to prevent radiation of RF signals e.g., if the receiver is used on a cable system which has a large signal level. This would be the case if the RF signal input to the tuner had to be led in a long conductive path on the tuner printed circuit board to make contact at an edge connection of the board. Additionally, a long unshielded lead can cause an impedance mismatch at the termination points.

SUMMARY OF THE INVENTION

A shielded modular tuner is horizontally mounted onto a chassis printed circuit board and is provided, through an aperture in the shield, with lead connections from the edge of the tuner printed circuit board to the chassis printed circuit board, for power supply, control signals, outputting a processed signal, etc. However, the RF signal is coupled to the tuner via a conductive pin extending from an RF signal conducting path on the chassis printed circuit board, passing through a second aperture in the shield, directly to the point on the tuner printed circuit board where the signal is to be inputted for tuner processing. In this way, the RF signal is injected directly into the tuner precisely where it is needed without being led along a longer path from the edge of the tuner printed circuit board, and without a shielded coaxial cable and accompanying connectors.

BRIEF DESCRIPTION OF THE DRAWINGS

FIG. 1 is a bottom perspective view of a horizontal mounting shielded tuner module having tuner printed circuit edge mounted pins and an RF input pin/lead protruding through the shielding distal from the printed circuit edge mounted pins.

FIG. 2 is a simplified side view representation of the tuner module of FIG. 1 shown mounted on a chassis printed circuit board with the RF input pin electrically connected to an RF signal bearing printed circuit conductor of the chassis printed circuit board with distal edge mounted pins electrically connected to respective chassis printed circuit leads.

DESCRIPTION OF THE PREFERRED EMBODIMENT(S)

Generally, tuner assemblies have a tuner printed circuit board(s) enclosed in shielding boxes which surround the tuner print circuit board(s) except for wiring terminals for interconnection of the tuner printed circuit board(s) to other circuitry, and is known in the prior art. The tuner printed circuit board(s) and components which are disposed upon the tuner printed circuit board(s) within the shielded volume are shielded from electromagnetic interference caused by extraneous signals or fields. This is particularly important for RF signals coming from an antenna or other such source because the signal level is very low and the signal has not been further amplified.

More particularly, referring now to FIGS. 1 and 2, a tuner 10 for a television set, VCR or other high-frequency equipment, includes a tuner printed circuit board 12 on which circuit components (not shown) are mounted and with the circuit board 12 being mounted within a shielding case 14 having electrically conductive frame 14a, electrically conductive top cover 14b and electrically conductive bottom cover 14c assembled together by electrically conductive spring fingers 16 or the like. Tabs 18 are provided to mount tuner 10 to a chassis printed circuit board 20 and can be used to electrically ground shielding case 14 by soldering, twisting, or the like. Electrically conductive pins/leads 22 are provided coming from an edge of printed circuit board 12 for connection to respective electrically conductive paths 24 on chassis printed circuit board 20.

The mechanical construction discussed above is known in the prior art. The specific configuration and operation of the tuner circuits form no part of the present invention, and accordingly will not be discussed further except as may be needed in order to explain the present invention disclosed and/or claimed.

According to aspects of the present invention, for RF signals it is desirable that the lead be short and direct for the reasons stated above. To accomplish this, rather than have a long and possibly meandering RF signal input lead leading from the tuner circuit input terminal to an edge 13 of printed circuit board 12 as with the other tuner circuit leads 15, an electrically conductive pin/lead 26 is connected at the tuner circuit input and extends away from the board 12, through aperture 30 in bottom plate 14c, and is connected to an RF signal carrying electrical conductor 28 disposed on chassis printed circuit board 20. In this way, not only is the RF signal input to the tuner short and direct, but a decrease in the length of the RF signal carrying conductor is also possible. Further, the shielding effect of the body of shield 14 acts to shield electrical conductor 28 by its proximate presence. Still further, shielding can be provided to electrical conductor 28 by the close proximity of grounded printed circuit conductors (not shown) similar to practices used on tuner printed circuit boards. The RF signal is coupled to electrical conductor 28 by means of a coupling connector coupling the RF signal to the apparatus, through isolation barrier circuitry (not shown), if appropriate.

Thus, the RF signal input is provided to the tuner in a short and direct path, without the cost of a coaxial cable and associated connector carrying the RF signal from the device RF signal input connector for the apparatus.

Although as shown herein that printed circuit boards 12, 20 are planar and rigid, it is within the contemplation of the present invention that either or both circuit boards 12, 20 may not be rigid.

What is claimed is:

1. An RF tuner apparatus comprising:

a shielding means forming a generally rectangular volume having thickness, and a first printed circuit board disposed and supported within the volume defined by the shielding means, the printed circuit board comprising tuner circuitry for processing RF signals and provided with a plurality of terminals extending from an edge of the printed circuit board through a first aperture in the shielding means for receiving power and providing output signals, the printed circuit board having an RF signal input means comprising an electrically conductive pin/lead distal from the edge of the printed circuit board and extending from the printed circuit board through a second aperture in the shield and directly connectable to an RF signal carrying electrical conductor of a second printed circuit board upon which the shielding means is mountable.

2. The tuner apparatus of claim 1 wherein the shielding means is mountable to the second printed circuit board with the RF signal input pin/lead extending from the first printed circuit board and connecting to the electrical conductor of the second printed circuit board.

3. The tuner apparatus of claim 2 wherein the RF input signal is coupled from a source to the electrical conductor via a distal connector.

4. An RF tuner apparatus comprising:

a shielding means forming a generally rectangular volume having thickness, and a first planar printed circuit board disposed and supported within the volume defined by the shielding means, the printed circuit board comprising tuner circuitry for processing RF signals and provided with a plurality of terminals extending from an edge of the printed circuit board through a first aperture in the shielding means for receiving power and providing output signals, the printed circuit board having an RF signal input means comprising a receptor for an electrically conductive pin/lead distal from the edge of the printed circuit board and extending from the printed circuit board through a second aperture in the shield and directly connected to an RF signal carrying electrical conductor of a second planar printed circuit board upon which the shielding means is mountable.

5. The tuner apparatus of claim 4 wherein the shielding means is mounted to the second printed circuit board with the planes of the first and second printed circuit boards being parallel, with the RF signal input pin/lead extending from the second printed circuit board and connecting to the receptor of the first printed circuit board.

6. The tuner apparatus of claim 5 wherein the RF input signal is coupled from a source to the electrical conductor via a distal connector.

* * * * *